US010607834B2

(12) United States Patent
Toyota et al.

(10) Patent No.: US 10,607,834 B2
(45) Date of Patent: Mar. 31, 2020

(54) METHOD OF MANUFACTURING SEMICONDUCTOR DEVICE BY ETCHING AND WASHING

(71) Applicant: JOLED INC., Tokyo (JP)

(72) Inventors: Motohiro Toyota, Tokyo (JP); Yoshihiro Oshima, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/190,127

(22) Filed: Nov. 13, 2018

(65) Prior Publication Data

US 2019/0333758 A1 Oct. 31, 2019

(30) Foreign Application Priority Data

Apr. 27, 2018 (JP) ................. 2018-086326

(51) Int. Cl.
| | |
|---|---|
| H01L 21/02 | (2006.01) |
| H01L 29/66 | (2006.01) |
| H01L 21/441 | (2006.01) |
| H01L 21/4763 | (2006.01) |
| H01L 29/24 | (2006.01) |
| H01L 29/786 | (2006.01) |
| B08B 3/08 | (2006.01) |
| H01L 21/4757 | (2006.01) |
| G02F 1/1368 | (2006.01) |
| H01L 27/32 | (2006.01) |

(52) U.S. Cl.
CPC .......... *H01L 21/02565* (2013.01); *B08B 3/08* (2013.01); *H01L 21/02082* (2013.01); *H01L 21/02271* (2013.01); *H01L 21/02631* (2013.01); *H01L 21/441* (2013.01); *H01L 21/47573* (2013.01); *H01L 21/47635* (2013.01); *H01L 29/24* (2013.01); *H01L 29/66969* (2013.01); *H01L 29/7869* (2013.01); *G02F 1/1368* (2013.01); *H01L 27/3262* (2013.01)

(58) Field of Classification Search
CPC ......... H01L 21/02082; H01L 21/02565; H01L 21/02631; H01L 21/441; H01L 21/47573; H01L 21/47635; H01L 21/02271
See application file for complete search history.

(56) References Cited

U.S. PATENT DOCUMENTS

| | | | | |
|---|---|---|---|---|
| 2006/0024972 A1* | 2/2006 | Hall | ................. | G03F 7/423 438/725 |
| 2011/0240998 A1* | 10/2011 | Morosawa | ......... | H01L 29/41733 257/57 |
| 2017/0271376 A1 | 9/2017 | Murai et al. | | |
| 2017/0287946 A1* | 10/2017 | Hiromasu | ............ | H01L 27/1225 |

FOREIGN PATENT DOCUMENTS

JP 2017-168642 A 9/2017

* cited by examiner

*Primary Examiner* — Michael Jung
(74) *Attorney, Agent, or Firm* — Hauptman Ham, LLP

(57) ABSTRACT

A method of manufacturing a semiconductor device includes forming a semiconductor film including an oxide semiconductor material, forming a gate electrode facing the semiconductor film, forming a gate insulating film between the gate electrode and the semiconductor film, the gate insulating film having a side face that is uncovered with the gate electrode; and washing the side face of the gate insulating film with use of a chemical liquid that is able to dissolve the oxide semiconductor material.

10 Claims, 7 Drawing Sheets

METHOD OF MANUFACTURING SEMICONDUCTOR DEVICE BY ETCHING AND WASHING

CROSS REFERENCE TO RELATED APPLICATIONS

This application claims the benefit of Japanese Priority Patent Application No. 2018-086326 filed on Apr. 27, 2018, the entire contents of which are incorporated herein by reference.

BACKGROUND

The technology relates to a method of manufacturing a semiconductor device with use of an oxide semiconductor material.

Recently, a semiconductor device using a thin film transistor (TFT) has found its application in a variety of electronic apparatuses. For example, a semiconductor film of the thin film transistor can include an oxide semiconductor material. Reference is made to Japanese Unexamined Patent Application Publication. No. 2017-168642.

SUMMARY

In such a semiconductor device, it is desirable to suppress occurrence of an error such as occurrence of a leakage electric current.

It is desirable to provide a method of manufacturing a semiconductor device which makes it possible to suppress occurrence of an error.

A method of manufacturing a semiconductor device according to one embodiment of the technology includes: forming a semiconductor film including an oxide semiconductor material; forming a gate electrode facing the semiconductor film; forming a gate insulating film between the gate electrode and the semiconductor film, the gate insulating film having a side face that is uncovered with the gate electrode; and washing the side face of the gate insulating film with use of a chemical liquid that is able to dissolve the oxide semiconductor material.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
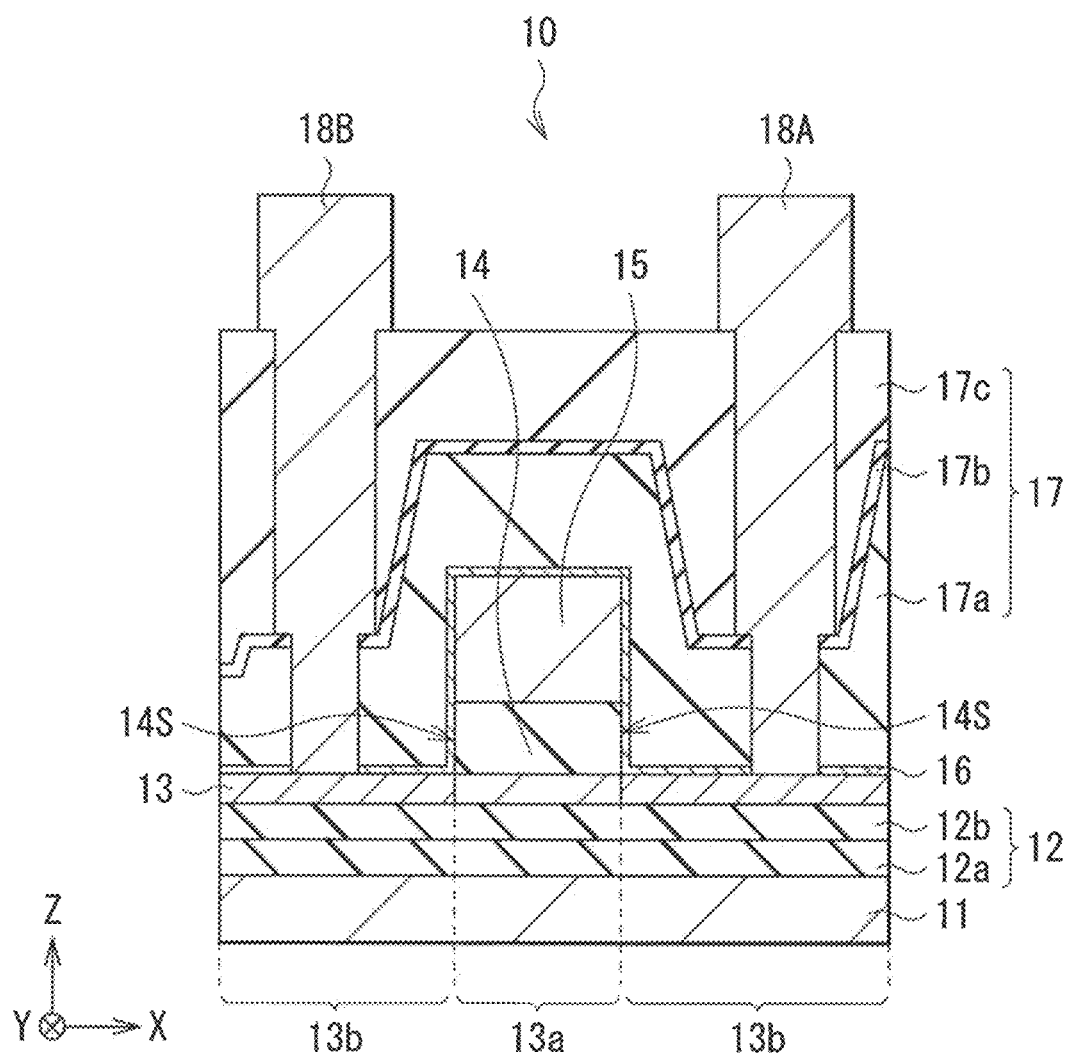
FIG. 1 is a schematic cross-sectional view of a configuration of a main portion of a transistor manufactured with use of a method of manufacturing according to one embodiment of the technology.

Some example embodiments of the technology are described below in detail with reference to the accompanying drawings.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. Embodiment (A method of manufacturing a transistor which includes washing processing of a side face of a gate insulating film)
2. Application Example 1 (Examples of a display unit and an imaging unit)
3. Application Example 2 (An example of an electronic apparatus)

EMBODIMENT

[Configuration]

FIG. 1 illustrates a schematic cross-sectional configuration of a main portion of a thin film transistor. The transistor 10 may be manufactured with use of a method of manufacturing a thin film transistor according to an embodiment of the technology as described below. The manufacturing method is described below with reference to FIG. 2. The transistor 10 may be, for example, a top-gate thin film transistor. The transistor 10 may be, for example, a drive element for displaying a display unit or an imaging unit. The display unit may be, for example, a later-described display unit 2A in FIG. 8. The imaging unit may be, for example, a later-described imaging unit 2B in FIG. 9. In one embodiment, the transistor 10 corresponds to a specific but non-limiting example of a "semiconductor device".

The top-gate transistor 10 may include a semiconductor film 13, a gate insulating film 14, and a gate electrode 15 in this order on a substrate 11, with an undercoat (UC) film 12 interposed between the substrate 11 and the semiconductor film 13. The transistor 10 may further include a metal oxide film 16, an interlayer insulating film 17, and source-drain electrodes 18A and 18B in this order on the gate electrode 15. The source-drain electrodes 18A and 18B may be each electrically coupled to the semiconductor film 13 (i.e. later-described low-resistance regions 13b) via a contact hole that penetrates the interlayer insulating film 17 and the metal oxide film 16.

The substrate 11 may be made of a material such as glass, quartz, or silicon. Alternatively, the substrate 11 may include a resin material such as polyethylene terephthalate (PET), polyimide (PI), polycarbonate (PC), or polyethylene naphthalate (PEN). Aside from these materials, a metal substance on which a film made of an insulating material is formed may be used as the substrate 11. The metal substrate may be a stainless steel (SUS) substrate without limitation.

The UC film 12 may be provided to prevent, for example, a substance such as a sodium ion from moving from the substrate 11 toward an upper layer. The UC film 12 may be made of an insulating material such as a silicon nitride (SiN) or a silicon oxide (SiO). For example, in the UC film 12, a UC film 12a and a UC film 12b may be stacked in this order from a position close to the substrate 11. For example, the UC film 12a may be configured by a silicon nitride (SiN) film, and the UC film 12b may be configured by a silicon oxide (SiO) film. The UC film 12 may be provided throughout an entire surface of the substrate 11.

The semiconductor film 13 may be so provided in a selective region on the UC film 12 as to extend in a predetermined direction. The predetermined direction may be, for example, in the X direction, i.e. a first direction, of FIG. 1. The semiconductor film 13 may be configured by an oxide semiconductor that includes, as a main component, an oxide of one or more elements of indium (In), gallium (Ga), zinc (Zn), tin (Sn), titanium (Ti), and niobium (Nb) without limitation. Specific but non-limiting examples of the oxide that may be used for the semiconductor film 13 may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO).

The semiconductor film 13 may include a channel region 13a and low-resistance regions 13b. The channel region 13a of the semiconductor layer 13 may face the gate electrode 15. The low-resistance regions 13b of the semiconductor layer 13 each may have an electric resistance lower than that of the channel region 13a. The portions of the semiconductor film 13 other than the channel region 13a may be, for example, the low-resistance regions 13b. For example, the source-drain electrode 18A may be coupled to the low-resistance region 13b that is adjacent to one side of the channel region 13a. Further, the source-drain electrode 18B may be coupled to the low-resistance region 13b that is adjacent to the other side of the channel region 13a. The semiconductor film 13 in each of the low-resistance regions 13b may be thinner, in the Z direction of FIG. 1, than the semiconductor film 13 in the channel region 13a. The semiconductor film 13 in the channel region 13a may have a thickness of, for example, 20 nm to 40 nm. The semiconductor film 13 in the low-resistance regions 13b may be thinner than the channel region 13a by about 2 nm to 15 nm.

The gate insulating film 14 may be provided on the channel region 13a of the semiconductor film 13. The gate insulating film 14 may have the same shape as that of the gate electrode 15 in a plan view of the X-Y plane in FIG. 1. In other words, the transistor 10 may be a thin film transistor having a self-aligned structure. The gate insulating film 14 may include a plurality of side faces 14S that are uncovered with the gate electrode 15 (i.e. exposed from the gate electrode 15 in an embodiment). The plurality of side faces 14S of the gate insulating film 14 each may be substantially aligned with each of a plurality of side faces of the gate electrode 15, in a substantially plan view. The side faces of the gate electrode 15 and the side faces 14S of the gate insulating film 14 each may be covered with, for example, the metal oxide film 16. In an embodiment, a manufacturing process of the transistor 10 may include washing the side faces 14S of the gate insulating film 14 with use of a chemical liquid, as described in detail below. Therefore, occurrence of a leakage electric current due to an adhered substance on the side faces 14S of the gate insulating film 14 is suppressed. The gate insulating film 14 may be configured by, for example, a single film such as a silicon oxide ($SiO_x$) film, a silicon nitride ($SiN_x$) film, a silicon oxynitride (SiON) film, or an aluminum oxide ($AlO_x$) film, or may be configured by a stacked film of two or more thereof.

The gate electrode 15 may face the semiconductor film 13 (i.e. the channel region 13a) with the gate insulating film 14 being interposed therebetween. The gate electrode 15 may serve to control a carrier density in the channel region 13a by means of application of a gate voltage (Vg), and may serve as a wiring line that supplies an electric potential. Non-limiting examples of a constituent material of the gate electrode 15 may include a simple substance of one of titanium (Ti), tungsten (W), tantalum (Ta), aluminum (Al), molybdenum (Mo), silver (Ag), neodymium (Nd), and copper (Cu), and an alloy of any combination thereof. Alternatively, the gate electrode 15 may be a compound that includes one or more of the above-mentioned materials, or a stacked film that includes two or more thereof. Further, for example, a transparent electrically conductive film made of a material such as ITO may also be used.

The metal oxide film 16 may be provided throughout the entire surface of the substrate 11, for example. The metal oxide film 16 may cover the gate electrode 15, and may be in contact with each of the low-resistance regions 13b of the semiconductor film 13. For example, an aluminum oxide ($Al_2O_3$) film may be used for the metal oxide film 16. Provision of such a metal oxide film 16 that is in contact with each of the low-resistance regions 13b makes it possible to stably maintain electric resistance of each of the low-resistance regions 13b. Non-limiting examples of a material that may be used for the metal oxide film 16 may include titanium oxide ($TiO_2$), tungsten oxide ($WO_3$), tantalum oxide ($Ta_2O_5$), or zirconium oxide ($ZrO_2$).

The interlayer insulating film 17 on the metal oxide film 16 may be provided throughout the entire surface of the substrate 11, for example. The interlayer insulating film 17 may be configured by, for example, a stacked film in which interlayer insulating films 17a, 17b, and 17c are stacked in this order from a position close to the metal oxide film 16. For example, a silicon oxide ($SiO_2$) film may be used for the interlayer insulating film 17a. A film such as a silicon nitride (SiN) film or a silicon oxynitride (SiON) film may also be used for the interlayer insulating film 17a. For example, an aluminum oxide ($Al_2O_3$) film may be used for the interlayer insulating film 17b. For example, a photo-sensitive resin film may be used for the interlayer insulating film 17c. In a specific but non-limiting example, the interlayer insulating film 17c may be configured by a polyimide resin film, for example. A resin such as novolak resin or acrylic resin may also be used for the interlayer insulating film 17c.

The source-drain electrodes 18A and 18B on the interlayer insulating film 17c may serve as a source or a drain of the transistor 10. The source-drain electrodes 18A and 18B may include, for example, metal or a transparent electrically conductive film similar to those listed as a constituent material of the above-described gate electrode 15. In one embodiment, a material having high electrical conductivity may be selected as the source-drain electrodes 18A and 18B. The source-drain electrodes 18A and 18B may be coupled to corresponding one of the low-resistance regions 13b of the semiconductor film 13 via the contact hole that penetrates the interlayer insulating film 17 and the metal oxide film 16.

[Method of Manufacturing]

Figure 2:
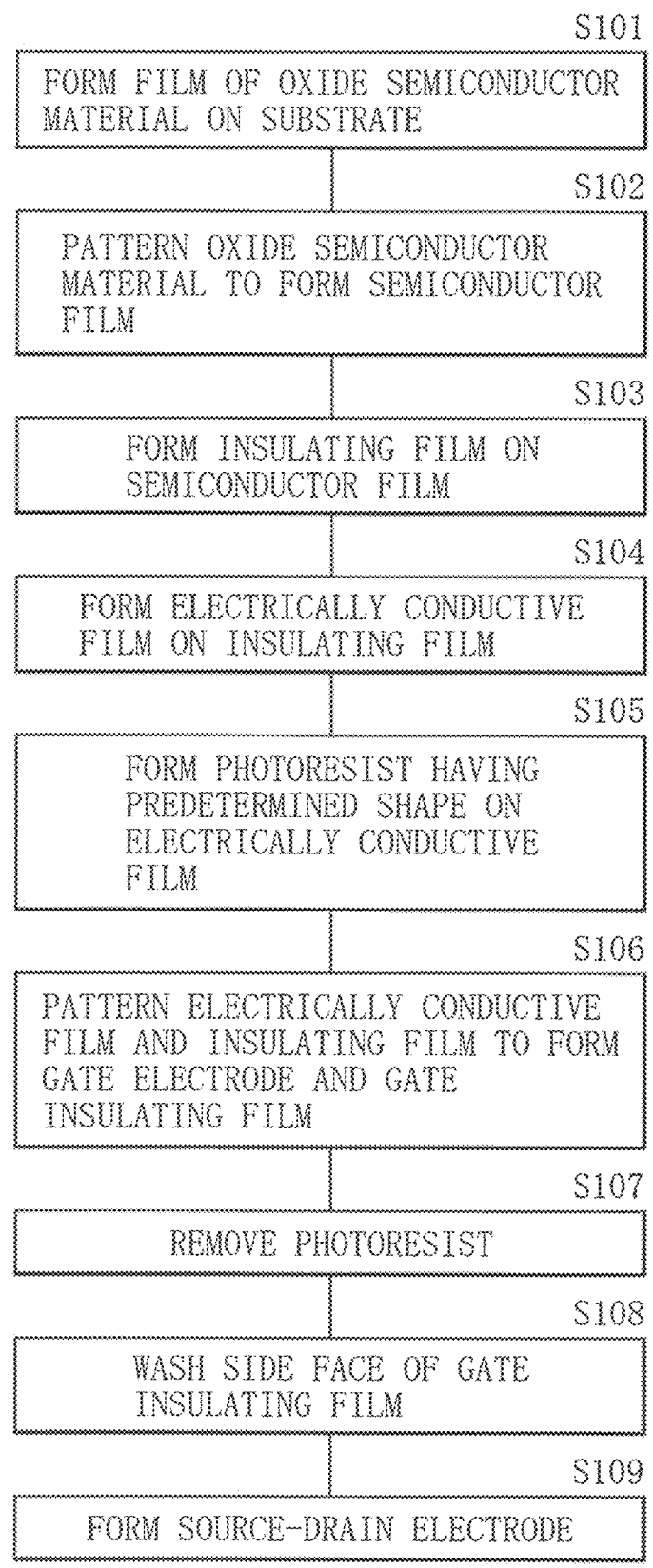
FIG. 2 is a flowchart illustrating, in order, processes for manufacturing method of the transistor illustrated in FIG. 1.

FIG. 2 illustrates an example of the manufacturing method of the transistor 10 in an order of processes. A description is given below of the manufacturing method of the transistor 10.

First, the UC film 12 may be formed throughout the entire surface of the substrate 11. Next, in step S101, a film of, for example, an oxide semiconductor material may be formed on the UC film 12, by means of a sputtering method, for example. Thereafter, in step S102, the film of the oxide semiconductor material may be patterned into a predetermined shape by means of photolithography and etching, for example, to form the semiconductor film 13.

After the formation of the semiconductor film 13, an insulating film and an electrically conductive film may be so formed throughout the entire substrate 11 as to cover the semiconductor film 13 in steps S103 and S104. The insulating film may form the gate insulating film 14. The electrically conductive film may form the gate electrode 15. After the formation of the electrically conductive film throughout the entire substrate 11, in step S105, a photoresist (i.e. a later-described photoresist PR of FIG. 3A) having a predetermined shape may be formed on the electrically conductive film.

In step S106, first, the electrically conductive film may be etched into a predetermined shape with use of the photoresist PR, following which the insulating film may be etched into a predetermined shape. This allows the gate electrode 15 and the gate insulating film 14 having the same shape each other in a plan view to be formed. For example, a dry etching method may be used for the etching of the electrically conductive film and the insulating film. In the process of patterning of the electrically conductive film and the insulating film, a region, of the semiconductor film 13, that is exposed from the gate insulating film 14 may be caused to have lower resistance by, for example, dry etching, to thereby form the low-resistance regions 13b of the semiconductor film 13. In an embodiment, in the process of patterning of the electrically conductive film and the insulating film, the low-resistance regions 13b of the semiconductor film 13 may be subjected to overetching, and thereby, each of the low-resistance regions 13b may be thinner than the channel region 13a. The low-resistance regions 13b may be formed in a later process. For example, the low-resistance regions 13b may be formed by means of oxygen-drawing from the metal oxide film 16.

Figure 3A:
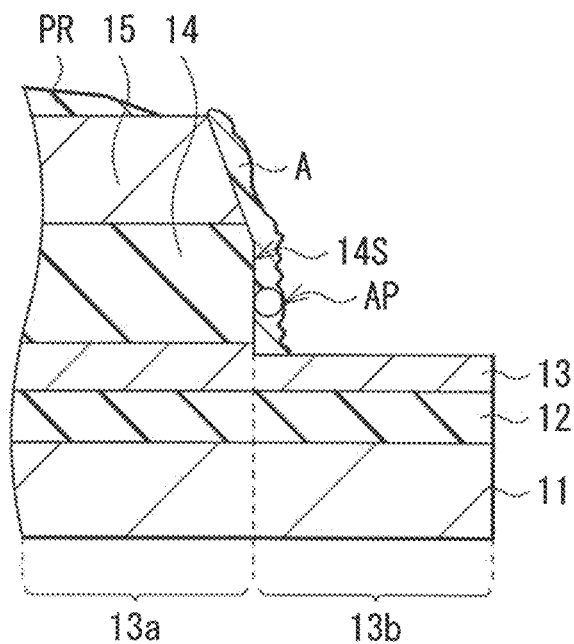
FIG. 3A is a schematic cross-sectional view of a state of one process (step S106) illustrated in FIG. 2.

FIG. 3A schematically illustrates a cross-sectional configuration of the gate electrode 15 and the gate insulating film 14 that are formed in step S106. For example, in this situation, the photoresist PR may be provided on the gate electrode 15, and an adhered substance A may exist on the side face of the gate electrode 15 and the side face 14S of the gate insulating film 14.

Figure 3B:
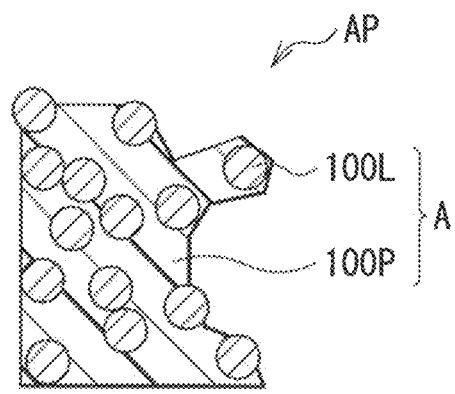
FIG. 3B is a schematic enlarged view of a cross-sectional configuration of an adhered substance illustrated in FIG. 3A.

FIG. 3B schematically illustrates an enlarged portion of the adhered substance A (i.e. a portion AP of FIG. 3A). The adhered substance A may include a polymer component 100P and a leakage component 100L. The polymer component 100P may be derived from, for example, the photoresist PR. The leakage component 100L may be generated due to overetching of the above-described semiconductor film 13. The leakage component 100L may be, for example, an electrically conductive component such as indium (In) included in the semiconductor film 13.

After the formation of the gate electrode 15 and the gate insulating film 14, the photoresist PR on the gate electrode 15 may be removed in step S107, following which the side face 14S of the gate insulating film 14 may be washed with use of the chemical liquid in step S108.

Figure 4:
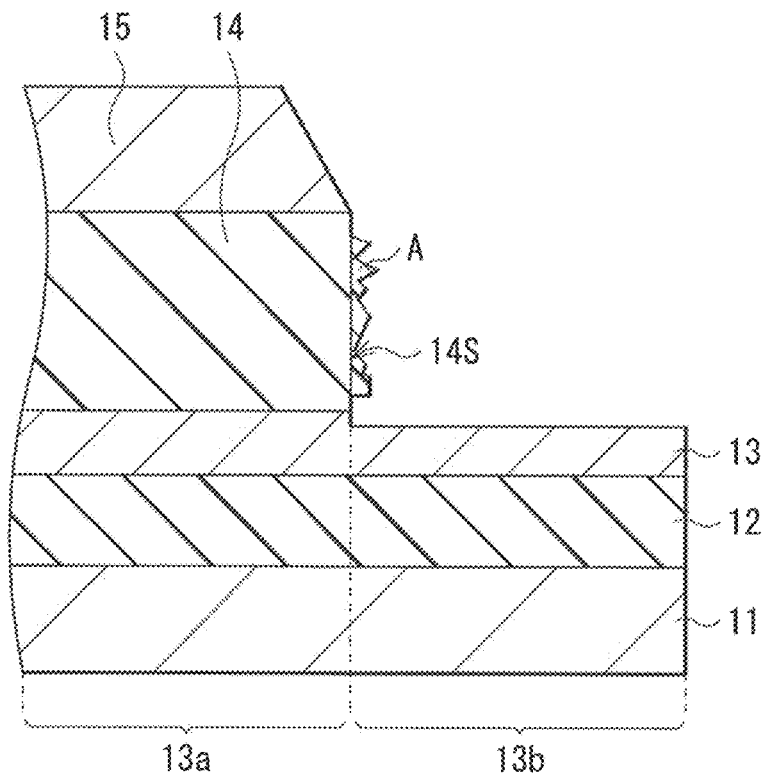
FIG. 4 is a schematic cross-sectional view of a state of the process subsequent to FIG. 3A.
Figure 5:
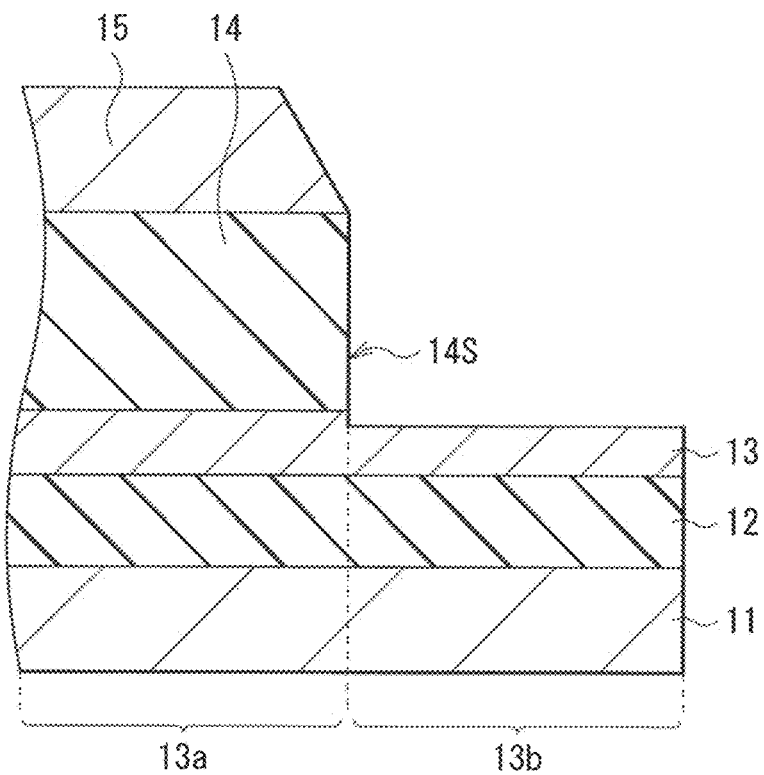
FIG. 5 is a schematic cross-sectional view of a state of the process subsequent to FIG. 4.

FIGS. 4 and 5 illustrate processes of steps S107 and S108 that are subsequent to FIG. 3A in order. In step S107, the photoresist PR may be removed with use of, for example, a resist removing liquid of which a main component is, for example, alkanolamine. In another embodiment, full-ashing by means of oxygen plasma may be performed with use of a dry etcher to remove the photoresist PR. At this occasion, the adhered substance A may remain on the side face 14S of the gate insulating film 14, as illustrated in FIG. 4. In step S108, the adhered substance A on the side face 14S of the gate insulating film 14 may be washed with use of the chemical liquid. The chemical liquid is able to dissolve the semiconductor film 13, for example. The chemical liquid may include a component that is able to cause the oxide semiconductor material configuring the semiconductor film 13 to be dissolved. In an embodiment, the chemical liquid may include a component such as monoethanolamine. This allows the leakage component 100L included in the adhered substance A to be removed from the side face 14S of the gate insulating film 14. In an embodiment, the washing may be performed, for example, by means of a wet etching method. For example, a component such as phosphate, acetic acid, nitric acid, or alkaline solution may be used for the chemical liquid.

Washing the side face 14S of the gate insulating film 14 may cause reduction in a film thickness of the semiconductor 13 in each of the low-resistance regions 13b. In one embodiment, an amount of reduction in film thickness of the semiconductor film 13 may be no greater than 5 nm. For example, the thickness of the semiconductor film 13 in each of the low-resistance regions 13b before washing the side face 14S of the gate insulating film 14 may be about 23 nm. It is possible to maintain the performance of each of the low-resistance regions 13b of the semiconductor film 13 by suppressing the amount of reduction in film thickness to no greater than 5 nm.

In one embodiment, removing the photoresist PR in step S107 and washing the side face 14S of the gate insulating film 14 in step S108 may be performed in the same process. This allows for simplification of the manufacturing process. In one embodiment, removing the photoresist PR and removing the adhered substance A on the side face 14S of the gate insulating film 14 may be performed simultaneously by performing the wet etching with use of the chemical liquid including monoethanolamine, for example.

The side face 14S of the gate insulating film 14 may be washed, following which the metal oxide film 16 and the interlayer insulating film 17 may be formed, in this order, throughout the entire substrate 11. Thereafter, in step S109, the source-drain electrodes 18A and 18B may be formed on the interlayer insulating film 17. The transistor 10 illustrated in FIG. 1 may be manufactured in this way.

[Operation]

In the transistor 10, the channel region 13a of the semiconductor film 13 may be activated when an ON voltage that is no less than a threshold voltage is applied to the gate electrode 15. This allows an electric current to flow between the paired low-resistance regions 13b with the channel region 13a interposed therebetween.

[Workings and Effects]

In the manufacturing method of the transistor 10 according to one embodiment of the technology, the side face 14S of the gate insulating film 14 may be washed with use of the chemical liquid. This removes the adhered substance A on the side face 14S of the gate insulating film 14. For example, the adhered substance A may include the leakage component 100L. The washing may be performed with use of the chemical liquid that is able to cause the oxide semiconductor material configuring the semiconductor film 13 to be dissolved. This removes the leakage component 100L from the side face 14S of the gate insulating film 14.

In a case where the transistor 10 is manufactured without the adhered substance A on the side face 14S of the gate insulating film 14 being removed, a leakage electric current may possibly be generated from the gate electrode 15 due to the leakage component 100L.

Figure 6A:
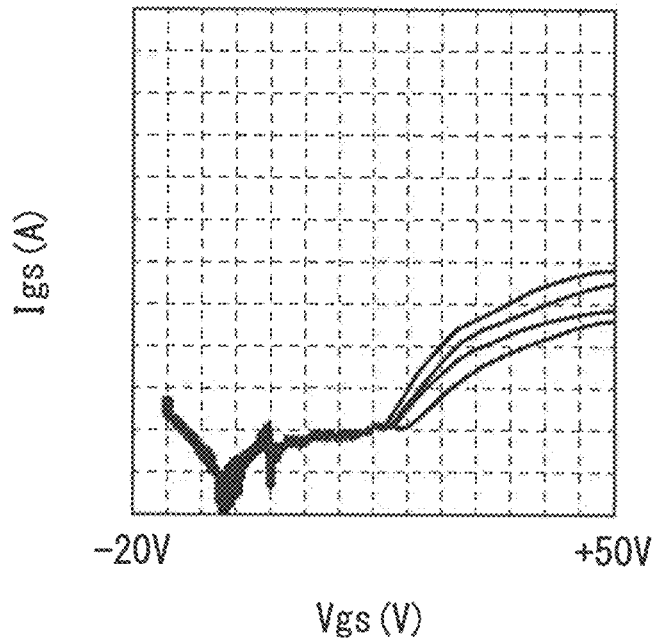
FIG. 6A is a diagram illustrating Igs-Vgs characteristics of the transistor that is manufactured without washing processing.
Figure 6B:
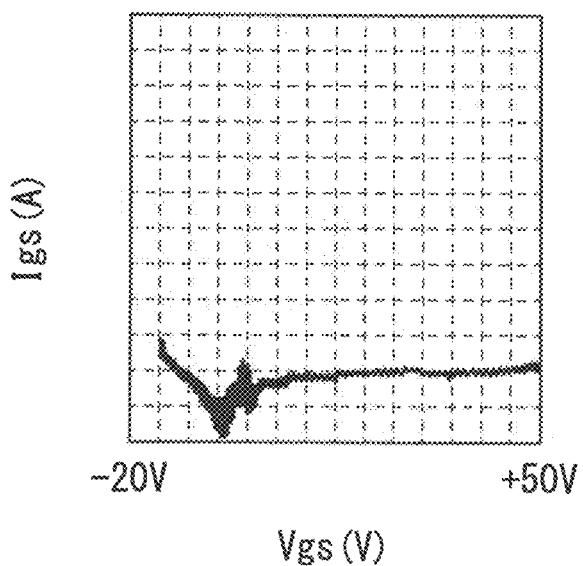
FIG. 6B is a diagram illustrating Igs-Vgs characteristics of the transistor that is manufactured with use of the manufacturing method illustrated in FIG. 2.

FIGS. 6A and 6B each illustrate a relationship between a gate voltage Vgs and a gate electric current Igs of the transistor 10. FIG. 6A illustrates characteristics of the transistor 10 that is manufactured without the adhered substance A on the side face 14S of the gate insulating film 14 being removed. FIG. 6B illustrates characteristics of the transistor 10 that is manufactured by washing the side face 14S of the gate insulating film 14. In a case where the transistor 10 is manufactured without the adhered substance A on the side face 14S of the gate insulating film 14 being removed, a gate leakage may possibly be generated (FIG. 6A). The gate leakage may possibly cause an error in the operation of the transistor 10. For example, a display failure may possibly occur on a display unit including the transistor 10.

In contrast, it is possible to suppress the generation of the gate leakage by washing the side face 14S of the gate insulating film 14 with use of the chemical liquid (FIG. 6B). This makes it possible to suppress the occurrence of an error in the transistor 10, leading to the suppression of the occurrence of an error such as the display failure on the display unit (a later-described display unit 2A in FIG. 8).

It is to be noted that it is confirmed with use of the Energy Dispersive X-ray spectroscopy (EDX) analysis that the leakage component 100L exists on the side face 14S of the gate insulating film 14 before washing, and the leakage component 100L is removed after washing.

In the washing processing of the side face 14S of the gate insulating film 14, the film thickness of the semiconductor film 13 in each of the low-resistance regions 13b may be reduced due to the chemical liquid. In one embodiment, an amount of reduction in film thickness of the semiconductor film 13 may be no greater than 5 nm.

Figure 7:
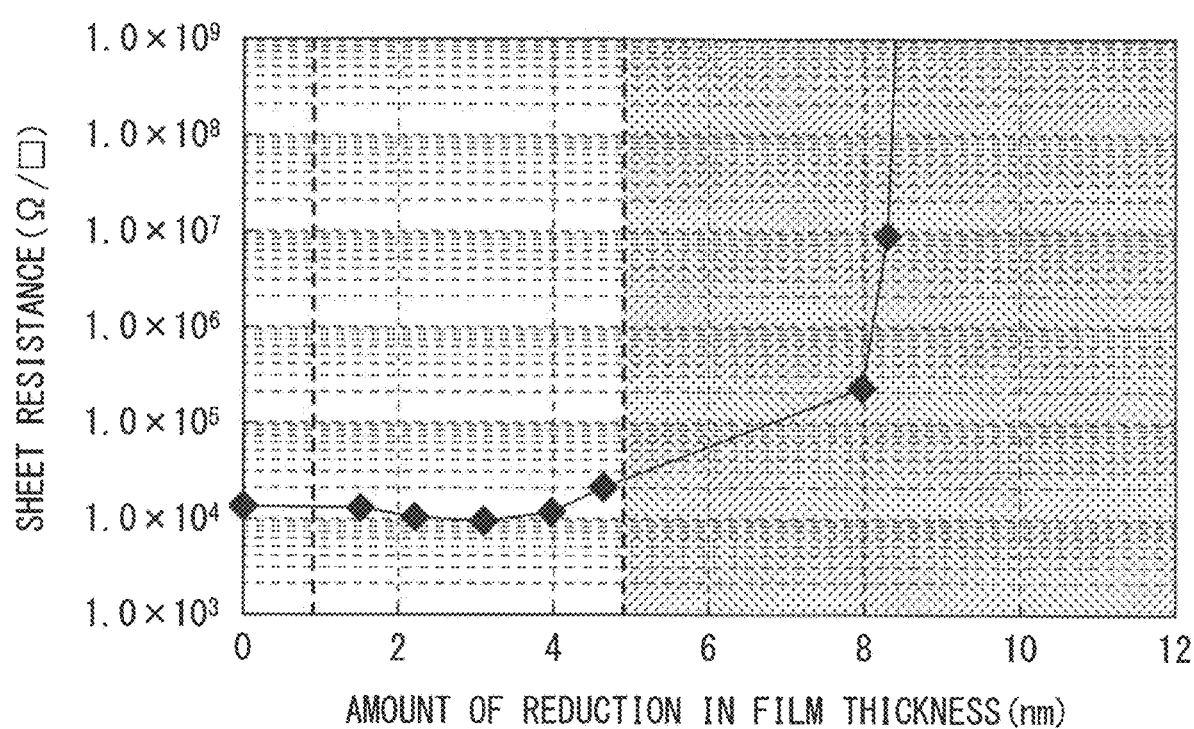
FIG. 7 is a diagram illustrating a relationship between an amount of reduction in film thickness and sheet resistance of the semiconductor film illustrated in FIG. 1.

FIG. 7 illustrates a relationship between an amount of reduction in film thickness of the semiconductor film 13 (i.e. the low-resistance regions 13b) and sheet resistance of the semiconductor film 13 (i.e. the low-resistance regions 13b). As illustrated in FIG. 7, when the amount of reduction in film thickness of the semiconductor 13 exceeds 5 nm, the sheet resistance steeply increases. Therefore, in one embodiment, the reduction in film thickness of the semiconductor film 13 may be no greater than 5 nm.

In one embodiment of the technology as described above, the side face 14S of the gate insulating film 14 may be washed with use of the chemical liquid, which makes it possible to remove the leakage component 100L adhered on the side face 14S of the gate insulating film 14. This allows the occurrence of the leakage electric current due to the adhered substance A on the side face 14S of the gate insulating film 14 to be suppressed, leading to the suppression of the occurrence of the error.

Application Example 1

The transistor 10 described in an example of the above-described embodiment may be used, for example, for a drive circuit of a unit such as a display unit (a later-described display unit 2A in FIG. 8 in an embodiment) or an imaging unit (a later-described imaging unit 2B in FIG. 9 in an embodiment).

Figure 8:
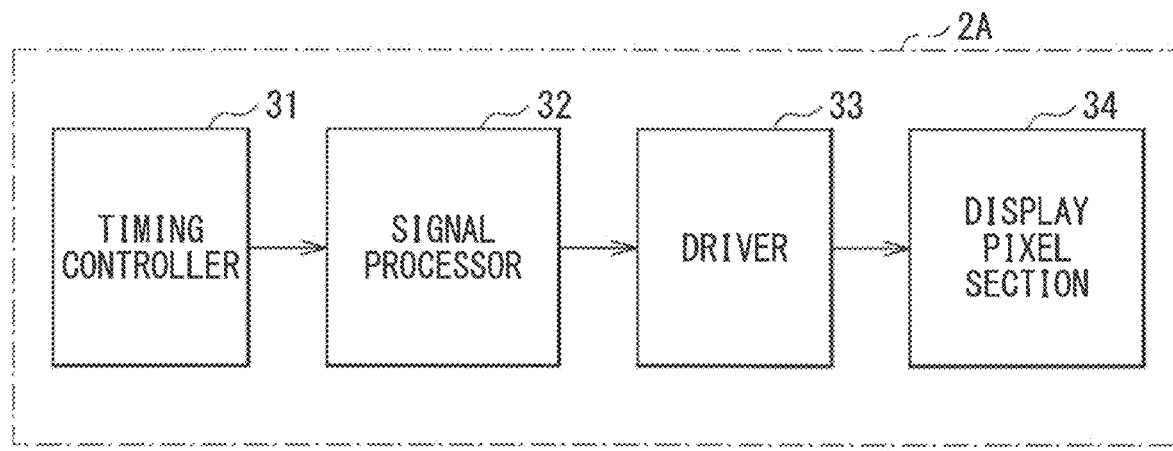
FIG. 8 is a block diagram illustrating a configuration of a display unit to which the transistor illustrated in FIG. 1 is applied.

FIG. 8 illustrates a block configuration of the display unit 2A. The display unit 2A may display, as an image, an image signal inputted from the outside or generated inside the display unit 2A. The display unit 2A may also be applied to a liquid crystal display, for example, aside from an organic electroluminescence (EL) display. The display unit 2A may include, for example, a timing controller 31, a signal processor 32, a driver 33, and a display pixel section 34.

The timing controller 31 may include a timing generator that generates various timing signals (i.e., control signals). The timing controller 31 may control driving of the signal processor 32, for example, on the basis of the various timing signals. The signal processor 32 may perform a predetermined correction on, for example, the digital image signal inputted from the outside, and may output the corrected image signal to the driver 33. The driver 33 may include circuits such as a scanning line drive circuit and a signal line drive circuit, for example. The driver 33 may drive each pixel of the display pixel section 34 through various control lines. The display pixel section 34 may include, for example, a display element and a pixel circuit. Non-limiting examples of the display element may include an organic EL element and a liquid crystal display element. The pixel circuit may drive the display element on a pixel basis. The above-described transistor 10 may be used, for example, for various circuits constituting a portion of the driver 33 or a portion of the display pixel section 34, among the above-described components.

Figure 9:
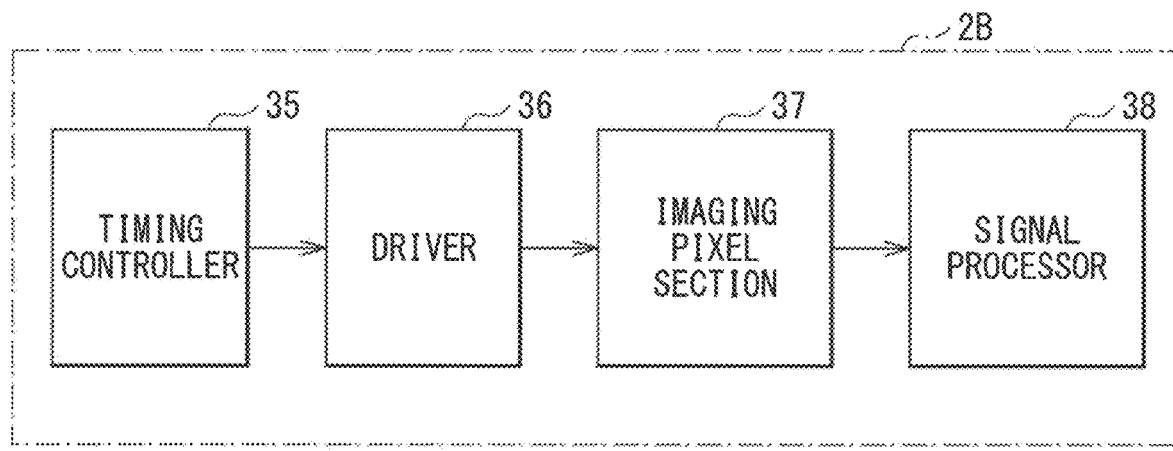
FIG. 9 is a block diagram illustrating a configuration of an imaging unit to which the transistor illustrated in FIG. 1 is applied.

FIG. 9 illustrates a block configuration of the imaging unit 2B. The imaging unit 2B may be a solid-state imaging unit that obtains an image, for example, as an electric signal. The imaging unit 2B may be configured by, for example, a charge coupled device (CCD) image sensor or a complementary metal oxide semiconductor (CMOS) image sensor. The imaging unit 2B may include, for example, a timing controller 35, a driver 36, an imaging pixel section 37, and a signal processor 38.

The timing controller 35 may include a timing generator that generates various timing signals (i.e. control signals). The timing controller 35 may control driving of the driver 36 on the basis of the various timing signals. The driver 36 may include, for example, a row selection circuit, an AD conversion circuit, and a horizontal transfer scanning circuit. The driver 36 may perform driving to read a signal from each pixel of the imaging pixel section 37 through various control lines. The imaging pixel section 37 may include, for example, an imaging element (i.e. a photoelectric conversion element in an embodiment) such as a photodiode, and a pixel circuit for reading of a signal. The signal processor 38 may apply various types of signal processing to the signal obtained from the imaging pixel section 37. The above-described transistor 10 may be used, for example, for various circuits constituting a portion of the driver 36 or a portion of the imaging pixel section 37, among the above-described components.

Application Example 2

Figure 10:
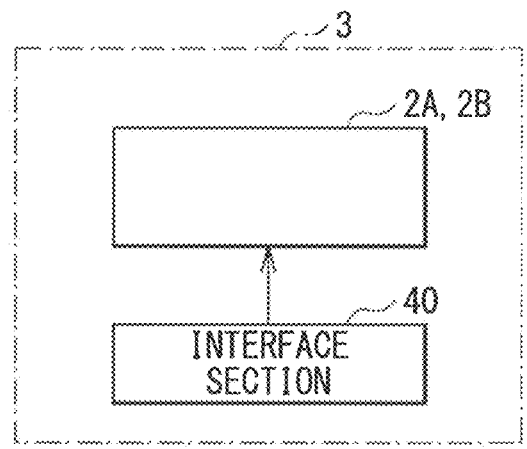
FIG. 10 is a block diagram illustrating a configuration of an electronic apparatus.

A unit such as the display unit 2A or the imaging unit 2B may be used for various types of electronic apparatuses. FIG. 10 illustrates a block configuration of an electronic apparatus 3. Non-limiting examples of the electronic apparatus 3 may include a television, a personal computer (PC), a smartphone, a tablet PC, a mobile phone, a digital still camera, and a digital video camera.

The electronic apparatus 3 may include, for example, the above-described display unit 2A (or imaging unit 2B) and an interface section 40. The interface section 40 may be an input section that receives various signals and a power supply, for example, from the outside. The interface section 40 may include a user interface such as a touch panel, a keyboard, and operation buttons, for example.

Although description has been given hereinabove with reference to the example embodiments, etc., the technology is not limited thereto, but may be modified in a wide variety of ways. For example, factors such as a material and a thickness of each layer exemplified in the foregoing example embodiments, etc. are illustrative and non-limiting. Any other material, any other thickness, and any other factor may be adopted besides those described above.

The effects described in the foregoing example embodiments, etc. are mere examples. The effects according to an embodiment of the disclosure may be other effects, or may further include other effects in addition to the effects described hereinabove.

It is to be noted that the technology may also have the following configurations.

(1)

A method of manufacturing a semiconductor device, the method including:

forming a semiconductor film including an oxide semiconductor material;

forming a gate electrode facing the semiconductor film;

forming a gate insulating film between the gate electrode and the semiconductor film, the gate insulating film having a side face that is uncovered with the gate electrode; and washing the side face of the gate insulating film with use of a chemical liquid that is able to dissolve the oxide semiconductor material.

(2)

The method of manufacturing the semiconductor device according to (1), in which the washing the side face of the gate insulating film is performed with use of a wet etching method.

(3)

The method of manufacturing the semiconductor device according to (1) or (2), in which the gate electrode and the gate insulating film are formed by forming an insulating film and an electrically conductive film in this order on the semiconductor film, and patterning the electrically conductive film and the insulating film in this order.

(4)

The method of manufacturing the semiconductor device according to (3), in which the electrically conductive film and the insulating film are patterned by forming a photoresist having a predetermined shape on the electrically conductive film, and forming the electrically conductive film and the insulating film into the predetermined shape with use of a dry etching method.

(5)

The method of manufacturing the semiconductor device according to (4), further including removing the photoresist, in which the removing the photoresist and the washing the side face of the gate insulating film are performed in a same process.

(6)

The method of manufacturing the semiconductor device according to any one of (1) to (5), further including forming a channel region and a low-resistance region in the semiconductor film, the channel region facing the gate electrode, the low-resistance region having electric resistance lower than that of the channel region.

(7)

The method of manufacturing the semiconductor device according to (6), in which the washing the side face of the gate insulating film causes reduction in a film thickness of the semiconductor film in the low-resistance region.

(8)

The method of manufacturing the semiconductor device according to any one of (1) to (7), in which the chemical liquid is monoethanolamine.

(9)

The method of manufacturing the semiconductor device according to any one of (1) to (8), in which the oxide semiconductor material is indium (In).

In the manufacturing method of the semiconductor device according to an embodiment of the technology, the side face of the gate insulating film is washed with use of the chemical liquid, which allows the adhered substance on the side face of the gate insulating film to be removed. Even in a case where the adhered substance includes an electrically conductive component derived from an oxide semiconductor material, the electrically conductive component is removed with use of the chemical liquid that is able to dissolve the oxide semiconductor material.

In the manufacturing method of the semiconductor device according to an embodiment of the technology, the side face of the gate insulating film is washed with use of the chemical liquid, which allows the electrically conductive component adhered on the side face of the gate insulating film to be removed. This makes it possible to suppress the occurrence of the leakage electric current due to the adhered substance on the side face of the gate insulating film, thus suppressing the occurrence of the error. It is to be noted that the effects described herein are not necessarily limitative, and may be any effects described in the disclosure.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A method of manufacturing a semiconductor device, the method comprising:
    forming a semiconductor film including an oxide semiconductor material;
    etching an electrically conductive film and an insulating film to form
        a gate electrode facing the semiconductor film, and
        a gate insulating film between the gate electrode and the semiconductor film, the gate insulating film having a side face not covered by the gate electrode; and
    after the etching, washing the side face of the gate insulating film with use of a liquid for dissolving the oxide semiconductor material.

2. The method of manufacturing the semiconductor device according to claim 1, wherein the washing the side face of the gate insulating film is performed with use of a wet etching method.

3. The method of manufacturing the semiconductor device according to claim 1, wherein the gate electrode and the gate insulating film are formed by forming the insulating film and the electrically conductive film in this order on the semiconductor film, and patterning the electrically conductive film and the insulating film in this order.

4. The method of manufacturing the semiconductor device according to claim 3, wherein the electrically conductive film and the insulating film are patterned by forming a photoresist having a predetermined shape on the electrically conductive film, and forming the electrically conductive film and the insulating film into the predetermined shape with use of a dry etching method.

5. The method of manufacturing the semiconductor device according to claim 1, further comprising forming a channel region and a low-resistance region in the semiconductor film, the channel region facing the gate electrode, the low-resistance region having electric resistance lower than that of the channel region.

6. The method of manufacturing the semiconductor device according to claim 5, wherein the washing the side face of the gate insulating film causes reduction in a film thickness of the semiconductor film in the low-resistance region.

7. The method of manufacturing the semiconductor device according to claim 1, wherein the oxide semiconductor material comprises indium (In).

8. The method of manufacturing the semiconductor device according to claim 1, further comprising:
    forming a photoresist having a predetermined shape on the electronically conductive film; and
    removing the photoresist.

9. A method of manufacturing the semiconductor device, the method comprising:
    forming a semiconductor film including an oxide semiconductor material;
    forming a gate electrode facing the semiconductor film, and a gate insulating film between the gate electrode and the semiconductor film, the gate insulating film having a side face not covered by the gate electrode,
        the gate electrode and the gate insulating film being formed by forming an insulating film and an electrically conductive film in this order on the semiconductor film, and patterning the electrically conductive film and the insulating film in this order, and
        the electrically conductive film and the insulating film being patterned by forming a photoresist having a predetermined shape on the electrically conductive film, and forming the electrically conductive film and the insulating film into the predetermined shape with use of a dry etching method;
    washing the side face of the gate insulating film with use of a chemical liquid for dissolving the oxide semiconductor material; and
    removing the photoresist, wherein
    the removing the photoresist and the washing the side face of the gate insulating film are performed in a same process.

10. A method of manufacturing the semiconductor device, the method comprising:
    forming a semiconductor film including an oxide semiconductor material;
    forming a gate electrode facing the semiconductor film;
    forming a gate insulating film between the gate electrode and the semiconductor film, the gate insulating film having a side face not covered by the gate electrode; and
    washing the side face of the gate insulating film with use of a chemical liquid for dissolving the oxide semiconductor material,
    wherein the chemical liquid comprises monoethanolamine.

* * * * *